(12) United States Patent
Wu

(10) Patent No.: US 10,803,277 B2
(45) Date of Patent: Oct. 13, 2020

(54) FINGERPRINT SENSING CIRCUIT AND FINGERPRINT SENSING APPARATUS

(71) Applicant: FOCALTECH ELECTRONICS, LTD., Grand Cayman (KY)

(72) Inventor: Che-Wei Wu, Guangdong (CN)

(73) Assignee: FOCALTECH ELECTRONICS, LTD., Grand Cayman (KY)

(*) Notice: Subject to any disclaimer, the term of this patent is extended or adjusted under 35 U.S.C. 154(b) by 339 days.

(21) Appl. No.: 15/870,676

(22) Filed: Jan. 12, 2018

(65) Prior Publication Data

US 2019/0012503 A1   Jan. 10, 2019

(30) Foreign Application Priority Data

Jul. 6, 2017   (CN) .......................... 2017 1 0547347

(51) Int. Cl.
*G06K 9/00* (2006.01)
*G01R 27/26* (2006.01)
(Continued)

(52) U.S. Cl.
CPC ............. *G06K 9/0002* (2013.01); *H01L 29/94* (2013.01); *H03F 3/45076* (2013.01); *H03F 3/45932* (2013.01)

(58) Field of Classification Search
CPC .......... G06K 9/00; G06K 9/001; G06K 9/002; G01R 27/26; G01R 27/2605; H03F 3/45; H01L 29/94; G01D 5/24
See application file for complete search history.

(56) References Cited

U.S. PATENT DOCUMENTS 8,872,586 B2 * 10/2014 Hsieh ...................... H03F 1/223
                                                              330/253
9,773,148 B2    9/2017 Mo et al.
(Continued)

FOREIGN PATENT DOCUMENTS

| CN | 104748770 A | 7/2015 |
| CN | 104898314 A | 9/2015 |
| TW | 201706908 A | 2/2017 |

OTHER PUBLICATIONS

First Office Action dated Jul. 23, 2018 for Taiwanese patent application No. 107104835, 7 pages, English summary provided by UNITALEN.

*Primary Examiner* — Neel D Shah
(74) *Attorney, Agent, or Firm* — Yue (Robert) Xu; Apex Attorneys at Law, LLP

(57) ABSTRACT

A fingerprint sensing circuit and a fingerprint sensing apparatus are provided. The fingerprint sensing circuit includes a sensing electrode; a first converting circuit connected to the sensing electrode and configured to convert a coupling capacitance sensed by the sensing electrode into a drive voltage, where the drive voltage is equal to a sum of a voltage variation converted from the coupling capacitance and a reference voltage; and a second converting circuit configured to generate a sensing current based on the drive voltage, and send the sensing current to a fingerprint signal processor, where the sensing current is equal to a product of a transconductance gain of the second converting circuit and the voltage variation, and the fingerprint signal processor performs fingerprint sensing based on the sensing current. With the fingerprint sensing circuit and the fingerprint sensing apparatus, the detection accuracy can be improved.

16 Claims, 10 Drawing Sheets

(51) Int. Cl.
  *H03F 3/45*   (2006.01)
  *G01D 5/24*   (2006.01)
  *H01L 29/94*  (2006.01)

(56) References Cited

U.S. PATENT DOCUMENTS

| | | |
|---|---|---|
| 9,898,639 B2 | 2/2018 | Lee |
| 2004/0096061 A1 | 5/2004 | Yano et al. |
| 2013/0015567 A1* | 1/2013 | Minamio ............ H01L 23/4334 |
| | | 257/676 |
| 2014/0021966 A1* | 1/2014 | Shahrokhi .......... G01R 27/2605 |
| | | 324/679 |
| 2016/0042216 A1* | 2/2016 | Yang .................... G06K 9/0002 |
| | | 382/124 |
| 2016/0307019 A1* | 10/2016 | Zhang ................. G06K 9/0002 |

* cited by examiner

FINGERPRINT SENSING CIRCUIT AND FINGERPRINT SENSING APPARATUS

CROSS REFERENCE OF RELATED APPLICATION

The present application claims the priority to Chinese Patent Application No. 201710547347.1, titled "FINGERPRINT SENSING CIRCUIT AND FINGERPRINT SENSING APPARATUS", filed on Jul. 6, 2017 with the State Intellectual Property Office of the People's Republic of China, which is incorporated herein by reference in its entirety.

FIELD

The present disclosure relates to the technical field of fingerprint sensing, and in particular to a fingerprint sensing circuit and a fingerprint sensing apparatus.

BACKGROUND

With the continuous development of science and technologies, an increasing number of electronic devices are applied in and bring great convenience to people's daily life and work. The electronic devices are important and indispensable tools for people nowadays. With the electronic devices becoming increasingly powerful, an increasing amount of personal information of increasing importance is stored in the electronic device. Therefore, the identity recognition function of the electronic device becomes an important method for guaranteeing the security of information stored in the electronic device, where the fingerprint recognition is one of the main methods for the electric device to perform identity recognition due to the advantages of convenience and high security, since the fingerprint is unique and remains unchanged for life.

The main components for performing fingerprint recognition in the electronic device include a fingerprint sensing circuit and a fingerprint signal processor. The fingerprint sensing circuit is used for acquiring an electrical signal including the fingerprint information, and the fingerprint signal processor is used for performing fingerprint sensing based on electrical signal. The fingerprint sensing circuit includes drive electrodes and sensing electrodes, where the sensing electrodes are coupled with each other to form multiple coupling capacitances. When a user touches a fingerprint recognition area of the electronic device, the coupling capacitances change due to differences in heights of ridges and valleys in a fingerprint pattern. The fingerprint sensing circuit detects the coupling capacitances and converts the coupling capacitances into voltage signals for the fingerprint signal processor to perform fingerprint recognition.

In general, since differences in heights of the ridges and valleys in the fingerprint of the user are small, during fingerprint recognition, variations in the coupling capacitances caused by the touching operation of the user are small. Therefore, a fingerprint sensing circuit with high sensing accuracy is required. However, the sensing accuracy of the existing fingerprint sensing circuits is low.

SUMMARY

To address the above issue, a fingerprint sensing circuit and a fingerprint sensing apparatus are provided according to the present disclosure, with which the sensing accuracy can be improved.

To achieve the above objective, the following technical solutions are provided according to the present disclosure.

A fingerprint sensing circuit is provided, which includes:
a sensing electrode;
a first converting circuit connected to the sensing electrode and configured to convert a coupling capacitance sensed by the sensing electrode into a drive voltage, where the drive voltage is equal to a sum of a voltage variation converted from the coupling capacitance and a reference voltage; and
a second converting circuit configured to generate a sensing current based on the drive voltage, and send the sensing current to a fingerprint signal processor, where the sensing current is equal to a product of a transconductance gain of the second converting circuit and the voltage variation, and the fingerprint signal processor performs fingerprint sensing based on the sensing current.

Preferably, in the fingerprint sensing circuit, the first converting circuit may include:
an operational amplifier including a non-inverting input terminal, an inverting input terminal, a grounded control terminal, and an output terminal, where the non-inverting input terminal is configured to receive the reference voltage, and the output terminal is configured to output the drive voltage;
a feedback circuit connected between the inverting input terminal and the output terminal; and
a first control switch, where a terminal of the first control switch is connected to the sensing electrode, and another terminal of the first control switch is connected to the inverting input terminal.

Preferably, in the fingerprint sensing circuit, the feedback circuit may include:
a first capacitor, where a terminal of the first capacitor is connected to the output terminal, and another terminal of the first capacitor is connected to the inverting input terminal; and
a reset switch, where a terminal of the reset switch is connected to the output terminal, and another terminal of the reset switch is connected to the inverting input terminal.

Preferably, in the fingerprint sensing circuit, the first converting circuit may further include a second capacitor, a terminal of the second capacitor is configured to receive a first voltage signal, and another terminal of the second capacitor is connected to a common node of the first control switch and the sensing electrode.

Preferably, in the fingerprint sensing circuit, the first converting circuit may further include a second control switch, a terminal of the second control switch is configured to receive a second voltage signal, and another terminal of the second control switch is connected to the common node.

Preferably, in the fingerprint sensing circuit, the second converting circuit may include a first n-channel metal-oxide-semiconductor (NMOS) transistor, a second NMOS transistor, and a third NMOS transistor, where,
a control terminal of the first NMOS transistor is connected to the first converting circuit to receive the drive voltage, a first electrode of the first NMOS transistor is connected to the fingerprint signal processor, and a second electrode of the first NMOS transistor is connected to a first electrode of the third NMOS transistor;
a control terminal of the second NMOS transistor is configured to receive the reference voltage, a first electrode of the second NMOS transistor is connected to the fingerprint signal processor, and a second electrode of the second NMOS transistor is connected to the first electrode of the third NMOS transistor; and a control terminal of the third NMOS transistor is configured to receive a first control voltage, and a second electrode of the third NMOS transistor is grounded.

Preferably, in the fingerprint sensing circuit, the second converting circuit may include a first p-channel metal-oxide-semiconductor (PMOS) transistor, a second PMOS transistor, and a third PMOS transistor, where, a control terminal of the first PMOS transistor is connected to the first converting circuit to receive the drive voltage, a first electrode of the first PMOS transistor is connected to the fingerprint signal processor, and a second electrode of the first PMOS transistor is connected to a first electrode of the third PMOS transistor;

a control terminal of the second PMOS transistor is configured to receive the reference voltage, a first electrode of the second PMOS transistor is connected to the fingerprint signal processor, and a second electrode of the second PMOS transistor is connected to the first electrode of the third PMOS transistor; and a control terminal of the third PMOS transistor is configured to receive a second control voltage, and a second electrode of the third PMOS transistor is configured to receive a third voltage signal.

Preferably, in the fingerprint sensing circuit, the second converting circuit may include a NMOS transistor, a second NMOS transistor, a third NMOS transistor, a first PMOS transistor, a second PMOS transistor, and a third PMOS transistor, where, a control terminal of the first NMOS transistor is connected to the first converting circuit to receive the drive voltage, a first electrode of the first NMOS transistor is connected to the fingerprint signal processor, and a second electrode of the first NMOS transistor is connected to a first electrode of the third NMOS transistor;

a control terminal of the second NMOS transistor is configured to receive the reference voltage, a first electrode of the second NMOS transistor is connected to the fingerprint signal processor, and a second electrode of the second NMOS transistor is connected to the first electrode of the third NMOS transistor;

a control terminal of the third NMOS transistor is configured to receive a first control voltage, and a second electrode of the third NMOS transistor is grounded;

a control terminal of the first PMOS transistor is connected to the control terminal of the first NMOS transistor via a level shifter, a first electrode of the first PMOS transistor is connected to the fingerprint signal processor, and a second electrode of the first PMOS transistor is connected to a first electrode of the third PMOS transistor;

a control terminal of the second PMOS transistor is connected to the control terminal of the second NMOS transistor via another level shifter, a first electrode of the second PMOS transistor is connected to the fingerprint signal processor, and a second electrode of the second PMOS transistor is connected to the first electrode of the third PMOS transistor; and a control terminal of the third PMOS transistor is configured to receive a second control voltage, and a second electrode of the third PMOS transistor is configured to receive a third voltage signal.

Preferably, in the fingerprint sensing circuit, the second converting circuit may include a NMOS transistor, a second NMOS transistor, a third NMOS transistor, a first PMOS transistor, a second PMOS transistor, and a third PMOS transistor, where, a control terminal of the first PMOS transistor is connected to the first converting circuit to receive the drive voltage, a first electrode of the first PMOS transistor is connected to the fingerprint signal processor, and a second electrode of the first PMOS transistor is connected to a first electrode of the third PMOS transistor;

a control terminal of the second PMOS transistor is configured to receive the reference voltage, a first electrode of the second PMOS transistor is connected to the fingerprint signal processor, and a second electrode of the second PMOS transistor is connected to the first electrode of the third PMOS transistor;

a control terminal of the third PMOS transistor is configured to receive a second control voltage, and a second electrode of the third PMOS transistor is configured to receive a third voltage signal;

a control terminal of the first NMOS transistor is connected to the control terminal of the first PMOS transistor via a level shifter, a first electrode of the first NMOS transistor is connected to the fingerprint signal processor, and a second electrode of the first NMOS transistor is connected to a first electrode of the third NMOS transistor;

a control terminal of the second NMOS transistor is connected to the control terminal of the second PMOS transistor via another level shifter, a first electrode of the second NMOS transistor is connected to the fingerprint signal processor, and a second electrode of the second NMOS transistor is connected to the first electrode of the third NMOS transistor; and a control terminal of the third NMOS transistor is configured to receive a first control voltage, and a second electrode of the third NMOS transistor is grounded.

A fingerprint sensing apparatus is further provided, which includes the fingerprint sensing circuit according to any one of the above.

As can be seen from the above description, in the fingerprint sensing circuit and the fingerprint sensing apparatus according to the technical solutions of the present disclosure, the first converting circuit acquires the coupling capacitance sensed by the sensing electrode, and acquire the drive voltage, where the drive voltage is equal to the sum of the voltage variation converted from the coupling capacitance and the reference voltage; the second converting circuit generates the sensing current based on the drive voltage, where the sensing current is equal to the product of the transconductance gain of the second converting circuit and the voltage variation.

Therefore, according to the technical solutions of the present disclosure, when fingerprint sensing is performed, the coupling capacitance sensed by the sensing electrode is converted into the voltage variation, which is then added with the reference voltage which is predetermined to acquire the drive voltage which is greater for driving the second converting circuit to generate the sensing current; and the fingerprint sensing processor performs fingerprint sensing based on the sensing current, thereby increasing the sensing accuracy.

BRIEF DESCRIPTION OF THE DRAWINGS

The drawings to be used in the description of the embodiments of the application or the conventional technology will be described briefly as follows, so that the technical solutions according to the embodiments of the present application or according to the conventional technology will become clearer. It is apparent that the drawings in the following description only illustrate some embodiments of the present application. For those skilled in the art, other drawings may be obtained according to these drawings without any creative work.

DETAILED DESCRIPTION

Technical solutions according to embodiments of the present disclosure are described clearly and completely hereinafter in conjunction with drawings used in the embodiments of the present disclosure. Apparently, the described embodiments are only some embodiments of the present disclosure rather than all the embodiments. Any other embodiments obtained by those skilled in the art based on the embodiments of the present disclosure without any creative work fall in the scope of protection of the present disclosure.

To make the above object, features and advantages of the present disclosure more apparent and easier to be understood, the disclosure is illustrated in detail in conjunction with the drawings and specific embodiments hereinafter.

Figure 1:
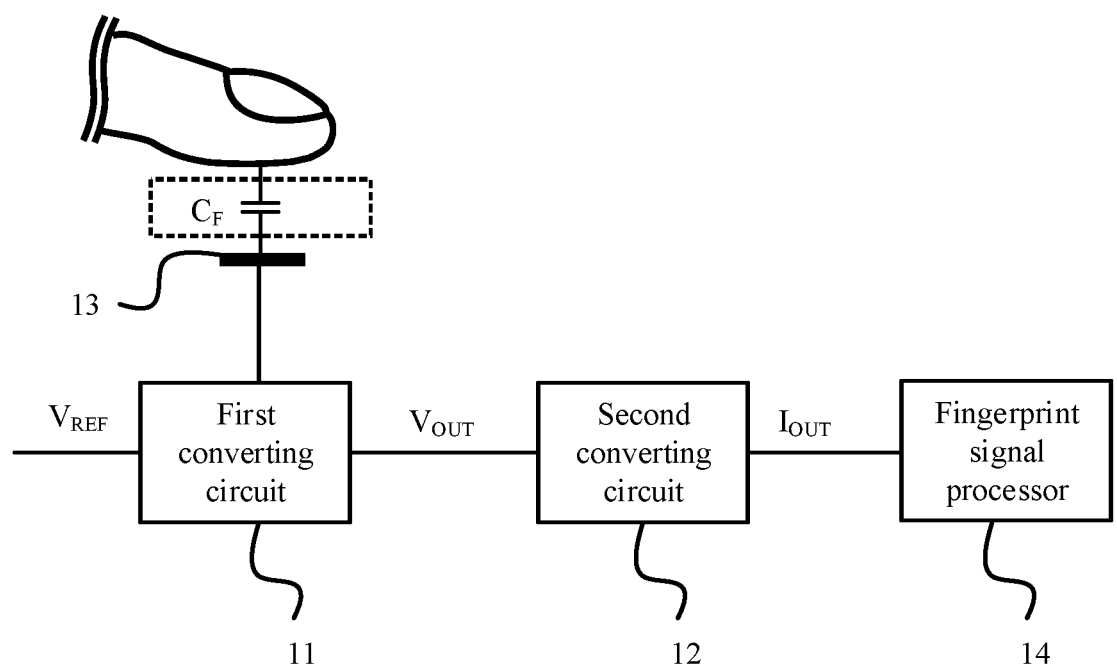
FIG. 1 is a schematic diagram illustrating modules of a fingerprint sensing circuit according to an embodiment of the present disclosure.

Reference is made to FIG. 1, which is a schematic diagram illustrating modules of a fingerprint sensing circuit according to an embodiment of the present disclosure. The fingerprint sensing circuit includes a sensing electrode 13. When a touching object, for example, a body part including a fingerprint such as a finger and a toe, approaches the fingerprint sensing apparatus, a coupling capacitance $C_F$ is generated between the touching object and the sensing electrode. In this embodiment, a finger is taken as an example for description. The fingerprint sensing circuit includes a first converting circuit 11 and a second converting circuit 12. The first converting circuit 11 is connected to the sensing electrode 13, and is configured to convert the coupling capacitance sensed by the sensing electrode 13 into a drive voltage $V_{OUT}$. The second converting circuit 12 is configured to generate a sensing current $I_{OUT}$ based on the drive voltage $V_{OUT}$, and send the sensing current $I_{OUT}$ to a fingerprint signal processor 14. The fingerprint signal processor 14 can acquire fingerprint information based on the sensing current $I_{OUT}$, thereby performing fingerprint recognition.

As shown in the following equation (1) and equation (2), the drive voltage $V_{OUT}$ is equal to a sum of a voltage variation $\Delta V$ converted from the coupling capacitance and a reference voltage $V_{REF}$. The sensing current $I_{OUT}$ is equal to a product of a transconductance gain G of the second converting circuit and the drive voltage $V_{OUT}$.

$$V_{OUT}=V_{REF}+\Delta V \tag{1}$$

$$I_{OUT}=G\times\Delta V \tag{2}$$

As can be seen, when the fingerprint sensing circuit according to the embodiment of the present disclosure performs fingerprint sensing, the first converting circuit 11 can convert the coupling capacitance between the finger and the sensing electrode 13 into the voltage variation $\Delta V$, and add the voltage variation $\Delta V$ with the predetermined reference voltage $V_{REF}$, to acquire the drive voltage $V_{OUT}$ which is greater, for driving the second converting circuit 12 to generate the sensing current $I_{OUT}$. Then, the fingerprint signal processor 14 performs fingerprint recognition based on the sensing current $I_{OUT}$, thereby increasing the sensing accuracy.

In the fingerprint sensing circuit according to the embodiment of the present disclosure, the first converting circuit 11 is an integrator, and the second converting circuit 12 is a voltage-current convertor. The first converting circuit 11 and the second converting circuit 12 may be implemented in a manner shown in FIG. 2.

Figure 2:
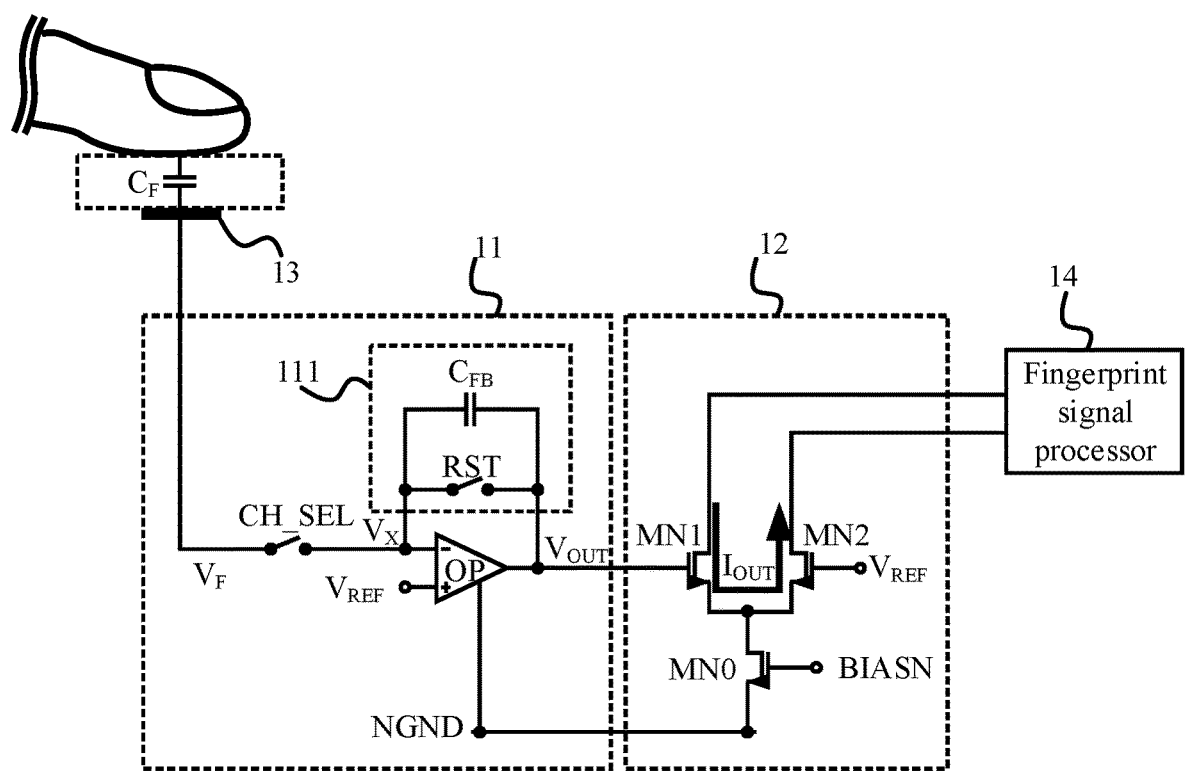
FIG. 2 is a schematic structural diagram of a fingerprint sensing circuit according to an embodiment of the present disclosure.

Reference is made to FIG. 2, which is a schematic structural diagram of a fingerprint sensing circuit according to an embodiment of the present disclosure. In this embodiment, the first converting circuit 11 includes an operational amplifier OP, a feedback circuit 111, and a first control switch CH_SEL. The operational amplifier OP includes a non-inverting input terminal, an inverting input terminal, a grounded control terminal and an output terminal, where the non-inverting input terminal is configured to receive the reference voltage $V_{REF}$, and the output terminal is configured to output the drive voltage $V_{OUT}$. The feedback circuit 111 is connected between the inverting input terminal and the output terminal. A terminal of the first control switch CH_SEL is connected to the sensing electrode 13, and another terminal of the first control switch CH_SEL is connected to the inverting input terminal. The grounded control terminal of the operational amplifier OP is fed with a grounded control voltage NGND.

The first converting circuit 11 may include multiple first control switches CH_SEL, each of which is connected to a corresponding sensing electrode 13. The first control switch CH_SEL is switched on or off according to a control signal. A complete fingerprint sensing circuit is formed with the first control switch CH_SEL which is switched on, such that fingerprint sensing can be implemented based on the coupling capacitance sensed by the sensing electrode 13 connected to the first control switch CH_SEL which is switched on. In this embodiment, the fingerprint sensing circuit includes only one first control switch CH_SEL, as shown in FIG. 2.

The feedback circuit 111 includes a first capacitor $C_{FB}$ and a reset switch RST. A terminal of the first capacitor $C_{FB}$ is connected to the output terminal, and another terminal of the first capacitor $C_{FB}$ is connected to the inverting input terminal. A terminal of the reset switch RST is connected to the output terminal, and another terminal of the reset switch RST is connected to the inverting input terminal. The reset switch RST is configured to be switched on and off at a predetermined time interval, for resetting charges across the first capacitor $C_{FB}$ as feedback.

In a case that the reset switch RST is switched on, the operation amplifier is virtually shorted, that is, the non-inverting input terminal and the inverting input terminal are equivalently shorted together since the non-inverting input terminal and the inverting input terminal have the same potential, where the potential $V_X$ at the non-inverting input terminal is equal to the reference voltage $V_{REF}$. In addition, the reference voltage $V_{REF}$ varies with the grounded control voltage NGND at the grounded control terminal.

When a finger approaches or touches the sensing electrode 13, the generated charge variation is outputted to the second inverting circuit 12 via the feedback circuit 111 connected to the inverting input terminal, and then to the fingerprint signal processor 14. The fingerprint signal processor 14 acquires the fingerprint information based on the sensing current $I_{OUT}$.

Each sensing electrode 13 can detect the magnitude of the coupling capacitance between the finger and the sensing electrode 13. The fingerprint includes ridges and valleys, where the ridge has a greater capacitance than the valley since the ridge is closer to the sensing electrode 13 as compared with the valley, and the valley has a smaller capacitance than the ridge since the valley is farther from the sensing electrode 13 as compared with the ridge. Based on the magnitude of the capacitance formed between the sensing electrode 13 and the fingerprint, the ridges and valleys in an area of the fingerprint corresponding to each sensing electrode 13 can be detected.

The second converting circuit includes a first NMOS transistor MN1, a second NMOS transistor MN2, and a third NMOS transistor MN0. A control terminal of the first NMOS transistor MN1 is connected to the first converting circuit 12 to receive the drive voltage $V_{OUT}$, a first electrode of the first NMOS transistor MN1 is connected to the fingerprint signal processor 14, and a second electrode of the first NMOS transistor MN1 is connected to a first electrode of the third NMOS transistor MN0. A control terminal of the second NMOS transistor MN2 is configured to receive the reference voltage $V_{REF}$, a first electrode of the second NMOS transistor MN2 is connected to the fingerprint signal processor 14, and a second electrode of the second NMOS transistor MN2 is connected to the first electrode of the third NMOS transistor MN0. A control terminal of the third NMOS transistor MN0 is configured to receive a first control voltage BIASN, and a second electrode of the third NMOS transistor MN0 is connected to the modulated ground NGND, where the potential at the modulated ground NGND may not be fixed to 0V. The modulated ground NGND is connected to the grounded control terminal of the operational amplifier OP. The first NMOS transistor MN1 and the second NMOS transistor MN2 form a differential transistor pair.

Figure 3:
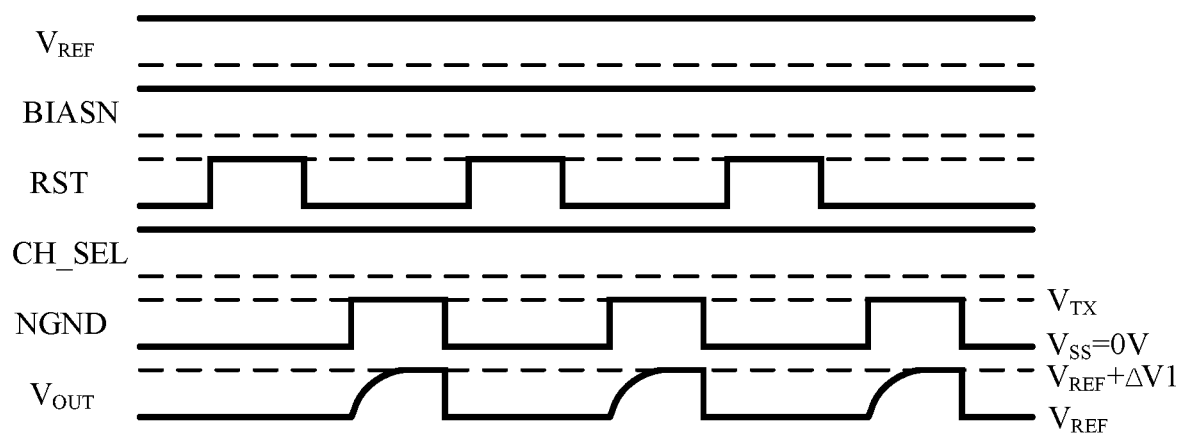
FIG. 3 is a timing diagram of fingerprint sensing performed by the fingerprint sensing circuit shown in FIG. 2.

It is assumed that the voltage variation converted from the coupling capacitance $\Delta V = \Delta V1$ when the fingerprint sensing circuit show in FIG. 2 performs fingerprint sensing. The fingerprint sensing circuit shown in FIG. 2 includes an integrator and a voltage-current convertor. The sensing electrode 13 converts the coupling capacitance sensed when the sensing electrode 13 is touched by a finger into the drive voltage $V_{OUT}$ with the integrator, and the differential transistor pair then generates the sensing current $I_{OUT}$ and sends the sensing current $I_{OUT}$ to the fingerprint signal processor 14 for signal processing. In this case, the timing diagram of fingerprint sensing is as shown in FIG. 3, which is a timing diagram of fingerprint sensing performed by the fingerprint sensing circuit shown in FIG. 2. The fingerprint signal processor 14 performs fingerprint sensing by switching on the reset switch RST and then switching off the reset switch RST. When the reset switch RST is switched on, $V_F = V_X = V_{OUT} = V_{REF}$. When the reset switch RST is then switched off, and the grounded control voltage NGND=$V_{TX}$, the generated drive voltage $V_{OUT}$ may be expressed by the following equation (1-1):

$$V_{OUT} = V_{REF} + \Delta V1 \tag{1-1}$$

$V_{TX}$ is a known voltage value, which is predetermined and may be a high level or a low level. $\Delta V1$ includes the fingerprint information, and may be expressed by the following equation (1-2):

$$\Delta V1 = \frac{C_F}{C_{FB}} V_{TX}. \tag{1-2}$$

The second converting circuit 12 outputs the sensing current $I_{OUT}$ with the differential transistor pair. The sensing current $I_{OUT}$ is a differential current signal, and may be expressed by the following equation (1-3):

$$I_{OUT} = G \times \Delta V1 \tag{1-3}$$

The fingerprint signal processor 14 performs fingerprint sensing by performing signal processing on the sensing current $I_{OUT}$ based on the equations (1-1), (1-2) and (1-3).

In the timing diagram shown in FIG. 3, each of the reference voltage $V_{REF}$, the first control voltage BIASN and the control voltage of the first control switch CH_SEL is a fixed level greater than 0V.

Both the control voltage of the reset switch RST and the grounded control voltage NGND may be square wave signals, but are not limited to square wave signals in this embodiment. Sinusoidal wave signals, trapezoidal wave signals, and non-periodic wave signals and the like may also be applied to this embodiment. When the grounded control voltage NGND is at a high level, the control voltage of the reset switch RST is at a low level. When the control voltage of the reset switch RST is at a high level, the grounded control voltage NGND is at a low level. The high level of the grounded control voltage NGND is equal to $V_{TX}$, and the low level $V_{SS}$ of grounded control voltage NGND is equal to 0V.

The drive voltage $V_{OUT}$ is a pulse signal. The drive voltage $V_{OUT}$ is at a low level when the grounded control voltage NGND is at a low level. The drive voltage $V_{OUT}$ increases gradually from a rising edge of the grounded control voltage NGND, and is changed from the maximum value to a low level at a falling edge of the grounded control voltage NGND. In this case, the low level of the drive voltage $V_{OUT}$ is the reference voltage $V_{REF}$, and the high level of the drive voltage $V_{OUT}$ is $V_{REF} + \Delta V1$.

Various stray capacitances are formed between different conductive components in the first converting circuit 11. Therefore, although the drive voltage $V_{OUT}$ outputted by the first converting circuit includes the fingerprint information, the fingerprint information directly acquired from the drive voltage $V_{OUT}$ has low accuracy due to severe interference caused by noise. In this embodiment, the second converting circuit 12 is additionally provided for generating the sensing current $I_{OUT}$ based on the drive voltage $V_{OUT}$. In addition, the second converting circuit 12 according to this embodiment includes the differential transistor pair. By selecting a differential transistor pair with an appropriate transconductance gain, the differential signal can be amplified properly. The second converting circuit 12 provides the fingerprint signal processor 14 with the amplified differential current signal, which is less susceptible to the influence of the stray capacitances between various components in the circuit during transmission to the fingerprint signal processor 14. Therefore, the fingerprint information acquired by fingerprints signal processor 14 based on the differential current signal has high accuracy.

Figure 4:
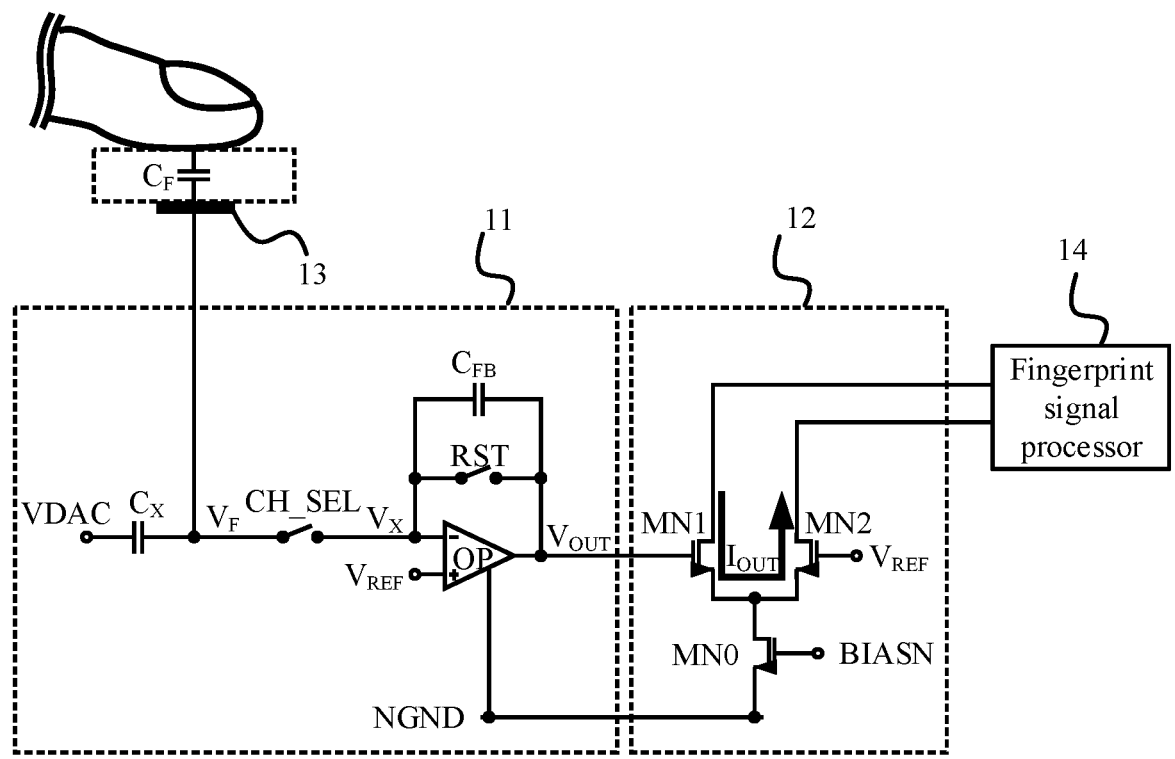
FIG. 4 is a schematic structural diagram of a fingerprint sensing circuit according to another embodiment of the present disclosure.

On the basis of the fingerprint sensing circuit shown in FIG. 2, the first converting circuit 11 may be as shown in FIG. 4, which is a schematic structural diagram of a fingerprint sensing circuit according to another embodiment of the present disclosure. On the basis of the embodiment shown in FIG. 2, the fingerprint sensing circuit shown in FIG. 4 further includes a second capacitor $C_X$, where a terminal of the second capacitor $C_X$ is configured to receive a first voltage signal VDAC, and another terminal of the second capacitor $C_X$ is connected to a common node of the first control switch CH_SEL and the sensing electrode 13.

Figure 5:
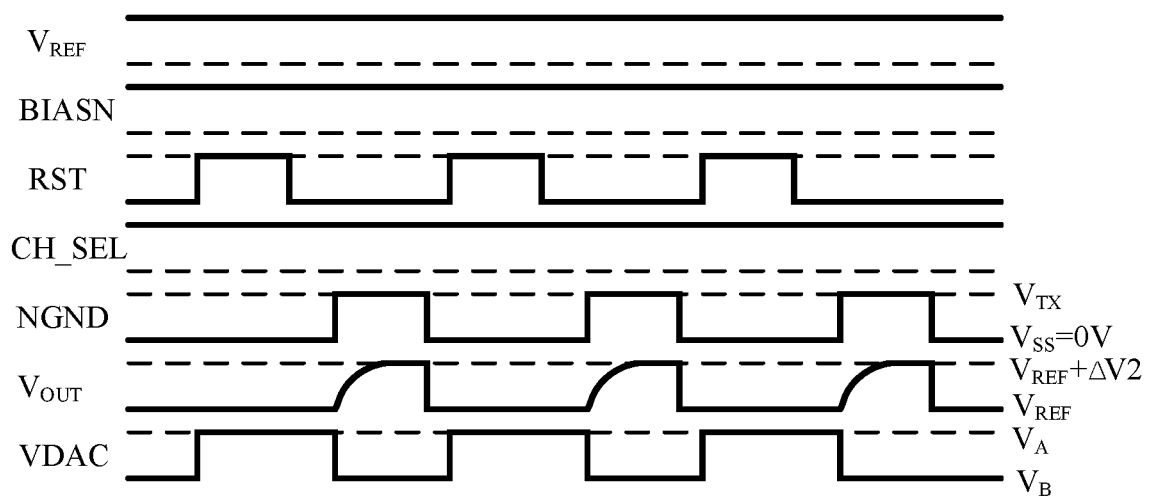
FIG. 5 is a timing diagram of fingerprint sensing performed by the fingerprint sensing circuit shown in FIG. 4.

In the fingerprint sensing circuit shown in FIG. 4, it is assumed that the voltage variation converted from the coupling capacitance $\Delta V = \Delta V2$, when the fingerprint sensing circuit shown in FIG. 4 performs fingerprint sensing. The fingerprint sensing circuit shown in FIG. 4 likewise includes an integrator and a voltage-current convertor. The sensing electrode 13 converts the coupling capacitance sensed when the sensing electrode 13 is touched by a finger into the drive voltage $V_{OUT}$ with the integrator, and the differential transistor pair then generates the sensing current $I_{OUT}$ and sends the sensing current $I_{OUT}$ to the fingerprint signal processor 14 for signal processing. In this case, the timing diagram of fingerprint sensing is as shown in FIG. 5, which is a timing diagram of fingerprint sensing performed by the fingerprint sensing circuit shown in FIG. 4. The fingerprint signal processor 14 performs fingerprint sensing by switching on the reset switch RST and then switching off the reset switch RST. When the reset switch RST is switched on, $V_F = V_X = V_{OUT} = V_{REF}$ and $VDAC = V_A$. When the reset switch RST is then switched off, $NGND = V_{TX}$ and $VDAC = V_B$, the generated drive voltage $V_{OUT}$ may be expressed by the following equation (2-1):

$$V_{OUT} = V_{REF} + \Delta V2 \quad (2\text{-}1).$$

$V_A$ and $V_B$ are known voltage values which are predetermined and are high levels. $\Delta V2$ includes fingerprint information, and may be expressed by the following equation (2-2):

$$\Delta V2 = \frac{C_F}{C_{FB}} V_{TX} + \frac{C_X}{C_{FB}} (V_A - V_B). \quad (2\text{-}2)$$

The second converting circuit 12 outputs the sensing current $I_{OUT}$ with the differential transistor pair. The sensing current $I_{OUT}$ is a differential current signal, and may be expressed by the following equation (2-3):

$$I_{OUT} = G \times \Delta V2 \quad (2\text{-}3).$$

Likewise, the fingerprint signal processor 14 performs fingerprint sensing by performing signal processing on the sensing current $I_{OUT}$ based on the equations (2-1), (2-2) and (2-3).

Figure 6:
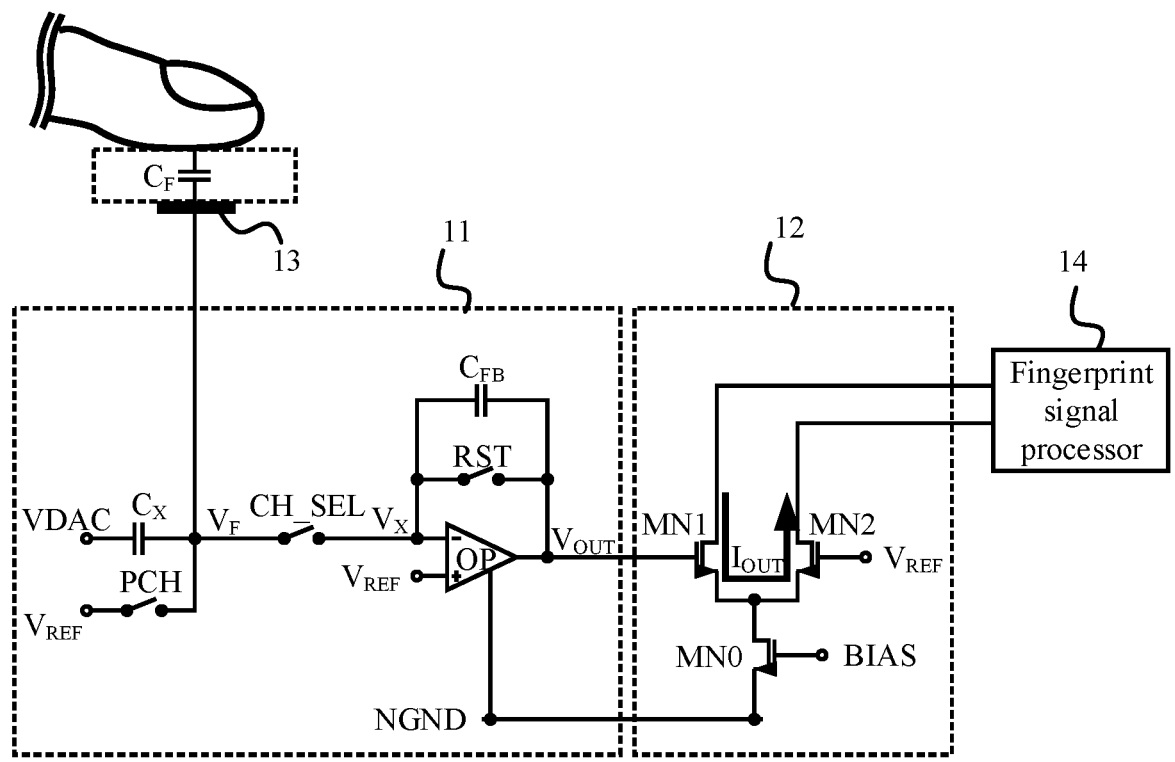
FIG. 6 is a schematic structural diagram of a fingerprint sensing circuit according to another embodiment of the present disclosure.

In the timing diagram shown in FIG. 5, the first voltage signal VDAC is a square wave signal, of which a high level is $V_A$ and a low level is $V_B$. On the basis of the fingerprint sensing circuit shown in FIG. 4, the first converting circuit 11 may be as shown in FIG. 6, which is a schematic structural diagram of a fingerprint sensing circuit according to another embodiment of the present disclosure. On the basis of the embodiment shown in FIG. 4, the first converting circuit 11 shown in FIG. 6 further includes a second control switch PCH, where a terminal of the second control switch PCH is configured to receive a second voltage signal $V_{PRE}$, and another terminal of the second control switch PCH is connected to the common node.

Figure 7:
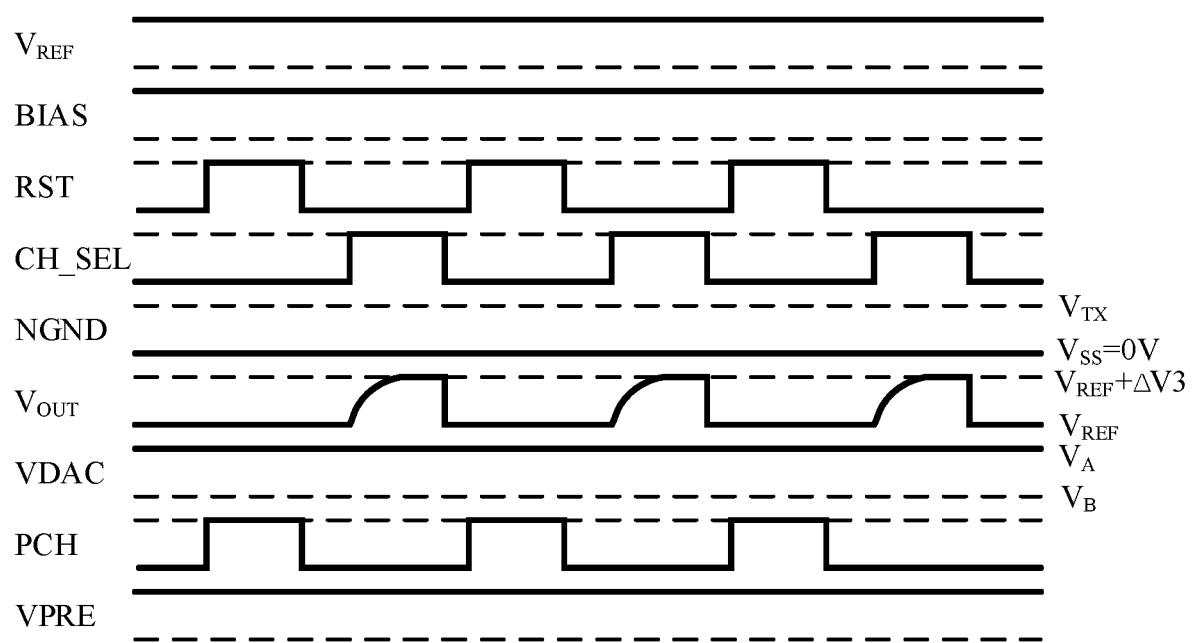
FIG. 7 is a timing diagram of fingerprint sensing performed by the fingerprint sensing circuit shown in FIG. 6.

In the fingerprint sensing circuit shown in FIG. 6, it is assumed that the voltage variation converted from the coupling capacitance $\Delta V = \Delta V3$ when the fingerprint sensing circuit shown in FIG. 6 performs fingerprint sensing. The fingerprint sensing circuit shown in FIG. 6 likewise includes an integrator and a voltage-current convertor. The sensing electrode 13 converts the coupling capacitance sensed when the sensing electrode 13 is touched by a finger into the drive voltage $V_{OUT}$ with the integrator, and the differential transistor pair then generates the sensing current $I_{OUT}$ and sends the sensing current $I_{OUT}$ to the fingerprint signal processor 14 for signal processing. In this case, the timing diagram of fingerprint sensing is as shown in FIG. 7, which is a timing diagram of fingerprint sensing performed by the fingerprint sensing circuit shown in FIG. 6. The fingerprint signal processor 14 performs fingerprint sensing according to the following principle: when the control voltage of the reset switch RST is at a high level, the control voltages of the first control switch CH_SEL and the second control switch PCH are at a low level and a high level, respectively, $V_F = V_{PRE}$, $V_X = V_{OUT} = V_{REF}$ and VDAC it maintained at $V_A$; and when the control voltage of the reset switch RST is at a low level, the control voltages of the first control switch CH_SEL and the second control switch PCH are at a high level and a low level, respectively, the generated drive voltage $V_{OUT}$ may be expressed by the following equation (3-1):

$$V_{OUT} = V_{REF} + \Delta V3 \quad (3\text{-}1),$$

where $\Delta V3$ includes fingerprint information, and may be expressed by the following equation (3-2):

$$\Delta V3 = \frac{C_F}{C_{FB}} (V_{REF} - V_{PRE}) + \frac{C_X}{C_{FB}} (V_{REF} - V_A). \quad (3\text{-}2)$$

The second converting circuit 12 outputs the sensing current $I_{OUT}$ with the differential transistor pair. The sensing current $I_{OUT}$ is a differential current signal, and may be expressed by the following equation (3-3):

$$I_{OUT} = G \times \Delta V3 \quad (3\text{-}3).$$

Likewise, the fingerprint signal processor 14 performs fingerprint sensing by performing signal processing on the sensing current $I_{OUT}$ based on the equations (3-1), (3-2) and (3-3).

In the timing diagram shown in FIG. 7, a control voltage for the first control switch CH_SEL is a square wave signal. The grounded control voltage NGND is equal to $V_{SS}$, which is 0V. The first voltage signal VDAC is a direct current signal, which is equal to $V_A$ and greater than $V_B$. The control voltage for the second control switch PCH is a square wave signal.

In the fingerprint sensing circuits shown in FIG. 2, FIG. 4 and FIG. 6, the second converting circuit 12 includes a first NMOS transistor MN1, a second NMOS transistor MN2 and a third NMOS transistor MN0, where the three NMOS transistors form the voltage-current convertor. In this case, the sensing current $I_{OUT}$ includes a current outputted by the second electrode of the first NMOS transistor MN1 and a current outputted by the second electrode of the second NMOS transistor MN2, where the two currents have the same amplitude and opposite directions.

Figure 8:
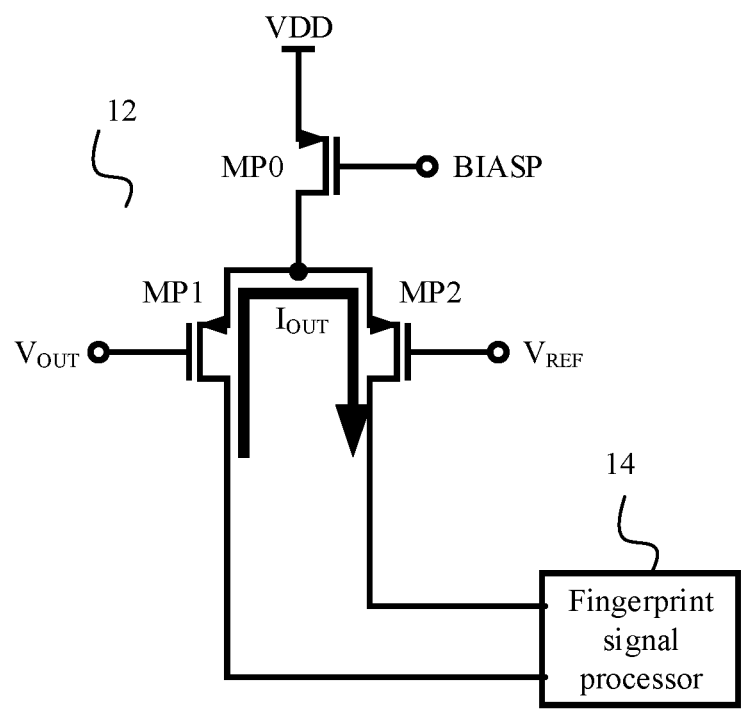
FIG. 8 is a schematic structural diagram of a second converting circuit according to an embodiment of the present disclosure.

In other embodiments, the second converting circuit 12 may also be as shown in FIG. 8, which is a schematic structural diagram of a second converting circuit according to an embodiment of the present disclosure. The second converting circuit 12 shown in FIG. 8 includes a first PMOS transistor MP1, a second PMOS transistor MP2, and a third PMOS transistor MP0.

A control terminal of the first PMOS transistor MP1 is connected to the first converting circuit to receive the drive voltage $V_{OUT}$, a first electrode of the first PMOS transistor MP1 is connected to the fingerprint signal processor 14, and a second electrode of the first PMOS transistor MP1 is connected to a first electrode of the third PMOS transistor MP0.

A control terminal of the second PMOS transistor MP2 is configured to receive the reference voltage $V_{REF}$, a first electrode of the second PMOS transistor MP2 is connected to the fingerprint signal processor 14, and a second electrode of the second PMOS transistor MP2 is connected to the first electrode of the third PMOS transistor MP0.

A control terminal of the third PMOS transistor MP0 is configured to receive a second control voltage BIASP, and a second electrode of the third PMOS transistor MP0 is configured to receive a third voltage signal VDD.

In the embodiment shown in FIG. 8, the sensing current $I_{OUT}$ includes the a current outputted by the second electrode of the first PMOS transistor MP1 and a current outputted by the second electrode of the second PMOS transistor MP2, where the two currents have the same amplitude and opposite directions.

Figure 9:
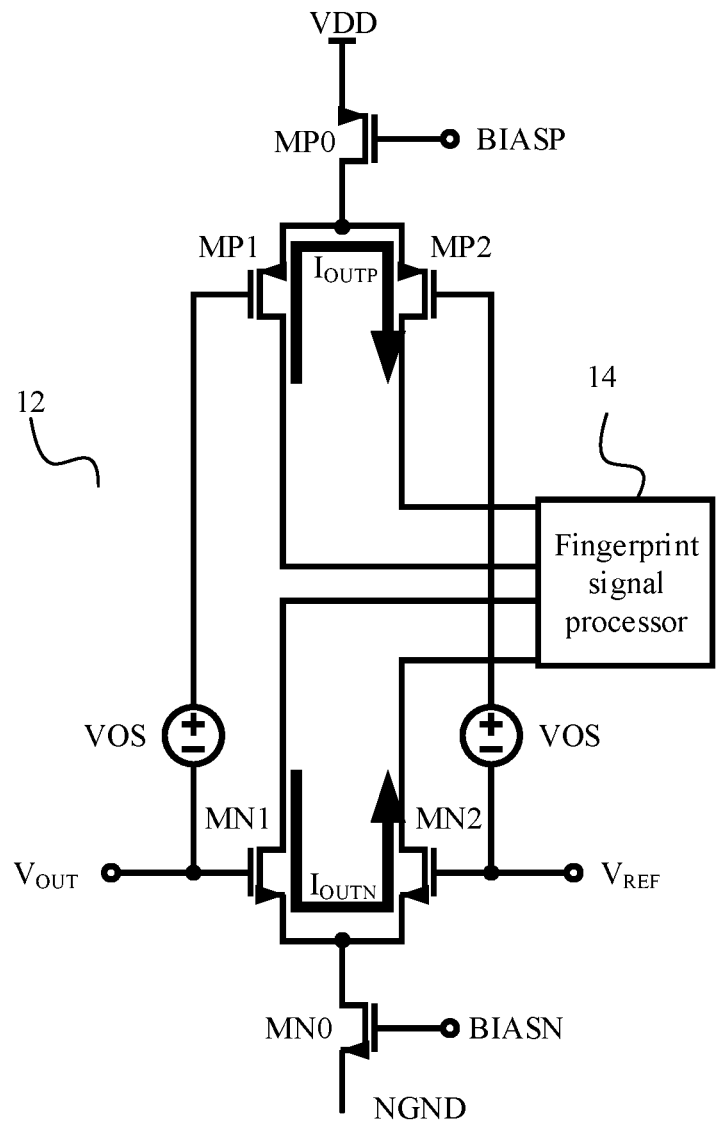
FIG. 9 is a schematic structural diagram of a second converting circuit according to another embodiment of the present disclosure.

In other embodiments, the second converting circuit 12 may be as shown in FIG. 9, which is a schematic structural diagram of a second converting circuit provided according to another embodiment of the present disclosure. The second converting circuit 12 shown in FIG. 9 includes a first NMOS transistor MN1, a second NMOS transistor MN2, a third NMOS transistor MN0, a first PMOS transistor MP1, a second PMOS transistor MP2 and a third PMOS transistor MP0.

A control terminal of the first NMOS transistor MN1 is connected to the first converting circuit 12 to receive the drive voltage $V_{OUT}$, a first electrode of the first NMOS transistor MN1 is connected to the fingerprint signal processor 14, and a second electrode of the first NMOS transistor MN1 is connected to a first electrode of the third NMOS transistor MN0.

A control terminal of the second NMOS transistor MN2 is configured to receive the reference voltage $V_{REF}$, a first electrode of the second NMOS transistor MN2 is connected to the fingerprint signal processor 14, and a second electrode of the second NMOS transistor MN2 is connected to the first electrode of the third NMOS transistor MN0.

A control terminal of the third NMOS transistor MN0 is configured to receive a first control voltage BIASN, and a second electrode of the third NMOS transistor MN0 is grounded.

A control terminal of the first PMOS transistor MP1 is connected to the control terminal of the first NMOS transistor MN1 via a level shifter VOS, a first electrode of the first PMOS transistor MP1 is connected to the fingerprint signal processor 14, and a second electrode of the first PMOS transistor MP1 is connected to a first electrode of the third PMOS transistor MP0.

A control terminal of the second PMOS transistor MP2 is connected to the control terminal of the second NMOS transistor MN2 via another level shifter VOS, a first electrode of the second PMOS transistor MP2 is connected to the fingerprint signal processor 14, and a second electrode of the second PMOS transistor MP2 is connected to the first electrode of the third PMOS transistor MP0.

A control terminal of the third PMOS transistor MP0 is configured to receive a second control voltage BIASP, and a second electrode of the third PMOS transistor MP0 is configured to receive a third voltage signal VDD.

In the embodiment shown in FIG. 9, the sensing current $I_{OUT}$ includes a current outputted by the second electrode of the first NMOS transistor MN1 and a current outputted the second electrode of the second NMOS transistor MN2, as well as a current outputted by the second electrode of the first PMOS transistor MP1 and a current outputted by the second electrode of the second PMOS transistor MP2. The current outputted by the second electrode of the first NMOS transistor MN1 and the current outputted by the second electrode of the second NMOS transistor MN2 have the same amplitude and opposite directions, as indicated by $I_{OUT}$ in FIG. 9. The current outputted by the second electrode of the first PMOS transistor MP1 and the current outputted by the second electrode of the second PMOS transistor MP2 have the same amplitude and opposite directions, as indicated by $I_{OUTP}$ in FIG. 9.

Figure 10:
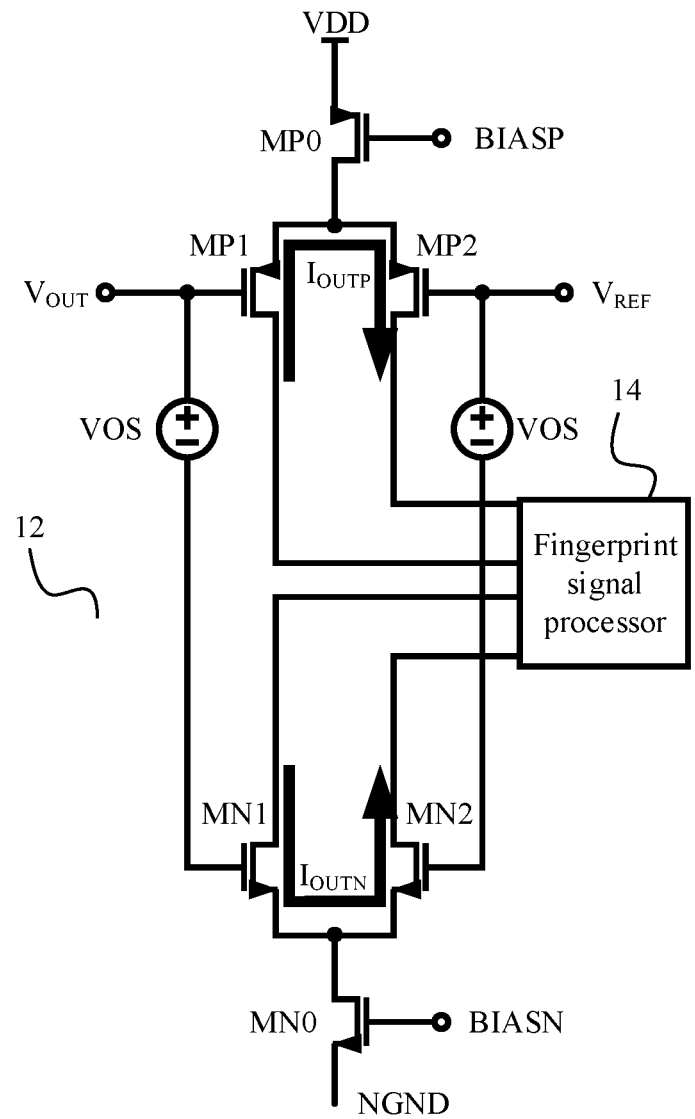
FIG. 10 is a schematic structural diagram of a second converting circuit according to another embodiment of the present disclosure.

In other embodiments, the second converting circuit 12 may be as shown in FIG. 10, which is a schematic structural diagram of a second converting circuit according to another embodiment of the present disclosure. Likewise, the second converting circuit 12 shown in FIG. 10 includes a first NMOS transistor MN1, a second NMOS transistor MN2, a third NMOS transistor MN0, a first PMOS transistor MP1, a second PMOS transistor MP2 and a third PMOS transistor MP0.

A control terminal of the first PMOS transistor MP1 is connected to the first converting circuit to receive the drive voltage $V_{OUT}$, a first electrode of the first PMOS transistor MP1 is connected to the fingerprint signal processor 14, and a second electrode of the first PMOS transistor MP1 is connected to a first electrode of the third PMOS transistor MP0.

A control terminal of the second PMOS transistor MP2 is configured to receive the reference voltage $V_{REF}$, a first electrode of the second PMOS transistor MP2 is connected to the fingerprint signal processor 14, and a second electrode of the second PMOS transistor MP2 is connected to the first electrode of the third PMOS transistor MP0.

A control terminal of the third PMOS transistor MP0 is configured to receive a second control voltage BIASP, and a second electrode of the third PMOS transistor MP0 is configured to receive a third voltage signal VDD.

A control terminal of the first NMOS transistor MN1 is connected to the control terminal of the first PMOS transistor MP1 via a level shifter VOS, a first electrode of the first NMOS transistor MN1 is connected to the fingerprint signal processor 14, and a second electrode of the first NMOS transistor MN1 is connected to a first electrode of the third NMOS transistor MN0.

A control terminal of the second NMOS transistor MN2 is connected to the control terminal of the second PMOS transistor MP2 via another level shifter VOS, a first electrode of the second NMOS transistor MN2 is connected to the fingerprint signal processor 14, and a second electrode of the second NMOS transistor MN2 is connected to the first electrode of the third NMOS transistor MN0.

A control terminal of the third NMOS transistor MN0 is configured to receive a first control voltage BIASN, and a second electrode of the third NMOS transistor MN0 is grounded.

In the embodiment shown in FIG. 10, the sensing current $I_{OUT}$ includes a current outputted by the second electrode of the first NMOS transistor MN1 and a current outputted by the second electrode of the second NMOS transistor MN2, as well as a current outputted by the second electrode of the first PMOS transistor MP1 and a current outputted by the second electrode of the second PMOS transistor MP2. The current outputted by the second electrode of the first NMOS transistor MN1 and the current outputted by the second electrode of the second NMOS transistor MN2 have the same amplitude and opposite directions, as indicated by $I_{OUTN}$ in FIG. 10. The current outputted by the second electrode of the first PMOS transistor MP1 and the current outputted by the second electrode of the second PMOS transistor MP2 have the same amplitude and opposite directions, as indicated by $I_{OUTP}$ in FIG. 10.

It should be noted that, in each of the embodiments of the present disclosure, the NMOS transistors have a same transconductance gain, which is equal to gmn, and the PMOS transistors have a same transconductance gain, which is equal to gmp.

For the embodiments shown in FIG. 2, FIG. 4 and FIG. 6, the transconductance gain G of the second converting circuit is equal to gmn. The third NMOS transistor is configured to generate a bias current. The first NMOS transistor MN1 and the second NMOS transistor MN2 acquire a voltage difference between the drive voltage $V_{OUT}$ outputted by the integrator and the reference voltage $V_{REF}$, to generate a differential output current, i.e., the sensing current $I_{OUT}$. The unit of the transconductance gain is Ampere per Volt.

For the embodiment shown in FIG. 8, the transconductance gain G of the second converting circuit is equal to gmp. The second converting circuit shown in FIG. 8 is a complementary form of the second converting circuit shown in FIG. 2, FIG. 4 or FIG. 6, where the voltage-current convertor shown in FIG. 8 is formed by three PMOS transistors. The third PMOS transistor MP0 is configured to generate a bias current. The first PMOS transistor MP1 and the second PMOS transistor MP2 acquire a voltage difference between the drive voltage $V_{OUT}$ outputted by the integrator and the reference voltage $V_{REF}$, to generate a differential output current, i.e., the sensing current $I_{OUT}$.

For the embodiments shown in FIG. 9 and FIG. 10, the transconductance gain G of the second converting circuit is equal to gmp+gmn. In the two embodiments of the second converting circuit shown in FIG. 9 and FIG. 10, both NMOS transistors and PMOS transistor are applied. The level shifter VOS functions to fix a level and shift a voltage, such that the NMOS transistor and the PMOS transistor can have different operation voltages.

In the fingerprint sensing circuit according to embodiments of the present disclosure, the sensing current is generated by the differential transistor pair, thus a better common mode noise rejection capability can be obtained, thereby achieving a high degree of accuracy. Specifically, for the embodiments shown in FIG. 9 and FIG. 10, both NMOS transistors and PMOS transistor are used as input components, thereby effectively increasing the dynamic operating range of the voltage-current convertor.

The fingerprint signal processor 14 described in the embodiments of the present disclosure may be a fingerprint sensing chip, or a processing chip in which the fingerprint sensing function is integrated, such as a processing chip in which the fingerprint sensing function and the display driving function are integrated.

On the basis of above embodiments of the fingerprint sensing circuit, a fingerprint sensing apparatus is provided according to another embodiment of the present disclosure. The fingerprint sensing apparatus includes the fingerprint sensing circuit according to the above embodiments. The fingerprint sensing apparatus may be a functional electronic device such as a cell phone, a tablet computer, or a wearable device.

The fingerprint sensing apparatus according to the embodiment of the present disclosure adopts the fingerprint sensing circuit according to the above embodiments. Therefore, the fingerprint sensing apparatus has a better common mode noise rejection capability, and has a high degree of accuracy. Further, the dynamic operating range of the voltage-current convertor is effectively increased.

The embodiments in this specification are described in a progressive way, each of which emphasizes the differences from others, and the same or similar parts among the embodiments can be referred to each other. Since the fingerprint sensing apparatus disclosed in the embodiments corresponds to the fingerprint sensing circuit therein, the description thereof is relatively simple, and for relevant matters references may be made to the description of the fingerprint sensing circuit.

With the above descriptions of the disclosed embodiments, the skilled in the art may practice or use the present disclosure. Various modifications to the embodiments are apparent for the skilled in the art. The general principle suggested herein can be implemented in other embodiments without departing from the spirit or scope of the disclosure. Therefore, the present disclosure should not be limited to the embodiments disclosed herein, but has the widest scope that is conformity with the principle and the novel features disclosed herein.

The invention claimed is:

1. A fingerprint sensing circuit, comprising:
 a sensing electrode;
 a first converting circuit connected to the sensing electrode and configured to convert a coupling capacitance sensed by the sensing electrode into a drive voltage, wherein the drive voltage is equal to a sum of a voltage variation converted from the coupling capacitance and a reference voltage; and
 a second converting circuit configured to generate a sensing current based on the drive voltage, and send the sensing current to a fingerprint signal processor, wherein the sensing current is equal to a product of a transconductance gain of the second converting circuit and the voltage variation, and the fingerprint signal processor performs fingerprint sensing based on the sensing current;
 wherein the second converting circuit comprises a first n-channel metal-oxide-semiconductor (NMOS) transistor, a second NMOS transistor, and a third NMOS transistor, wherein,
 a control terminal of the first NMOS transistor is connected to the first converting circuit to receive the drive voltage, a first electrode of the first NMOS transistor is connected to the fingerprint signal processor, and a second electrode of the first NMOS transistor is connected to a first electrode of the third NMOS transistor;

a control terminal of the second NMOS transistor is configured to receive the reference voltage, a first electrode of the second NMOS transistor is connected to the fingerprint signal processor, and a second electrode of the second NMOS transistor is connected to the first electrode of the third NMOS transistor; and a control terminal of the third NMOS transistor is configured to receive a first control voltage, and a second electrode of the third NMOS transistor is grounded.

2. The fingerprint sensing circuit according to claim 1, wherein the first converting circuit comprises:

an operational amplifier comprising a non-inverting input terminal, an inverting input terminal, a grounded control terminal, and an output terminal, wherein the non-inverting input terminal is configured to receive the reference voltage, and the output terminal is configured to output the drive voltage;

a feedback circuit connected between the inverting input terminal and the output terminal; and a first control switch, wherein a terminal of the first control switch is connected to the sensing electrode, and another terminal of the first control switch is connected to the inverting input terminal.

3. The fingerprint sensing circuit according to claim 2, wherein the feedback circuit comprises:

a first capacitor, wherein a terminal of the first capacitor is connected to the output terminal, and another terminal of the first capacitor is connected to the inverting input terminal; and a reset switch, wherein a terminal of the reset switch is connected to the output terminal, and another terminal of the reset switch is connected to the inverting input terminal.

4. The fingerprint sensing circuit according to claim 2, wherein the first converting circuit further comprises a second capacitor, a terminal of the second capacitor is configured to receive a first voltage signal, and another terminal of the second capacitor is connected to a common node of the first control switch and the sensing electrode.

5. The fingerprint sensing circuit according to claim 4, wherein the first converting circuit further comprises a second control switch, a terminal of the second control switch is configured to receive a second voltage signal, and another terminal of the second control switch is connected to the common node.

6. A fingerprint sensing apparatus, comprising the fingerprint sensing circuit according to claim 1.

7. The fingerprint sensing apparatus according to claim 6, wherein the first converting circuit comprises:

an operational amplifier comprising a non-inverting input terminal, an inverting input terminal, a grounded control terminal, and an output terminal, wherein the non-inverting input terminal is configured to receive the reference voltage, and the output terminal is configured to output the drive voltage;

a feedback circuit connected between the inverting input terminal and the output terminal; and a first control switch, wherein a terminal of the first control switch is connected to the sensing electrode, and another terminal of the first control switch is connected to the inverting input terminal.

8. The fingerprint sensing apparatus according to claim 7, wherein the feedback circuit comprises:

a first capacitor, wherein a terminal of the first capacitor is connected to the output terminal, and another terminal of the first capacitor is connected to the inverting input terminal; and a reset switch, wherein a terminal of the reset switch is connected to the output terminal, and another terminal of the reset switch is connected to the inverting input terminal.

9. The fingerprint sensing apparatus according to claim 7, wherein the first converting circuit further comprises a second capacitor, a terminal of the second capacitor is configured to receive a first voltage signal, and another terminal of the second capacitor is connected to a common node of the first control switch and the sensing electrode.

10. The fingerprint sensing apparatus according to claim 9, wherein the first converting circuit further comprises a second control switch, a terminal of the second control switch is configured to receive a second voltage signal, and another terminal of the second control switch is connected to the common node.

11. A fingerprint sensing circuit, comprising:

a sensing electrode;

a first converting circuit connected to the sensing electrode and configured to convert a coupling capacitance sensed by the sensing electrode into a drive voltage, wherein the drive voltage is equal to a sum of a voltage variation converted from the coupling capacitance and a reference voltage; and a second converting circuit configured to generate a sensing current based on the drive voltage, and send the sensing current to a fingerprint signal processor, wherein the sensing current is equal to a product of a transconductance gain of the second converting circuit and the voltage variation, and the fingerprint signal processor performs fingerprint sensing based on the sensing current;

wherein the second converting circuit comprises a first p-channel metal-oxide-semiconductor (PMOS) transistor, a second PMOS transistor, and a third PMOS transistor, wherein, a control terminal of the first PMOS transistor is connected to the first converting circuit to receive the drive voltage, a first electrode of the first PMOS transistor is connected to the fingerprint signal processor, and a second electrode of the first PMOS transistor is connected to a first electrode of the third PMOS transistor;

a control terminal of the second PMOS transistor is configured to receive the reference voltage, a first electrode of the second PMOS transistor is connected to the fingerprint signal processor, and a second electrode of the second PMOS transistor is connected to the first electrode of the third PMOS transistor; and a control terminal of the third PMOS transistor is configured to receive a second control voltage, and a second electrode of the third PMOS transistor is configured to receive a third voltage signal.

12. A fingerprint sensing circuit, comprising:

a sensing electrode;

a first converting circuit connected to the sensing electrode and configured to convert a coupling capacitance sensed by the sensing electrode into a drive voltage, wherein the drive voltage is equal to a sum of a voltage variation converted from the coupling capacitance and a reference voltage; and a second converting circuit configured to generate a sensing current based on the drive voltage, and send the sensing current to a fingerprint signal processor, wherein the sensing current is equal to a product of a transconductance gain of the second converting circuit and the voltage variation, and the fingerprint signal processor performs fingerprint sensing based on the sensing current;

wherein the second converting circuit comprises a first n-channel metal-oxide-semiconductor (NMOS) transistor, a second NMOS transistor, a third NMOS transistor, a first p-channel metal-oxide-semiconductor (PMOS) transistor, a second PMOS transistor, and a third PMOS transistor, wherein, a control terminal of the first NMOS transistor is connected to the first converting circuit to receive the drive voltage, a first electrode of the first NMOS transistor is connected to the fingerprint signal processor, and a second electrode of the first NMOS transistor is connected to a first electrode of the third NMOS transistor;

a control terminal of the second NMOS transistor is configured to receive the reference voltage, a first electrode of the second NMOS transistor is connected to the fingerprint signal processor, and a second electrode of the second NMOS transistor is connected to the first electrode of the third NMOS transistor;

a control terminal of the third NMOS transistor is configured to receive a first control voltage, and a second electrode of the third NMOS transistor is grounded;

a control terminal of the first PMOS transistor is connected to the control terminal of the first NMOS transistor via a level shifter, a first electrode of the first PMOS transistor is connected to the fingerprint signal processor, and a second electrode of the first PMOS transistor is connected to a first electrode of the third PMOS transistor;

a control terminal of the second PMOS transistor is connected to the control terminal of the second NMOS transistor via another level shifter, a first electrode of the second PMOS transistor is connected to the fingerprint signal processor, and a second electrode of the second PMOS transistor is connected to the first electrode of the third PMOS transistor; and a control terminal of the third PMOS transistor is configured to receive a second control voltage, and a second electrode of the third PMOS transistor is configured to receive a third voltage signal.

13. A fingerprint sensing circuit, comprising:
a sensing electrode;
a first converting circuit connected to the sensing electrode and configured to convert a coupling capacitance sensed by the sensing electrode into a drive voltage, wherein the drive voltage is equal to a sum of a voltage variation converted from the coupling capacitance and a reference voltage; and
a second converting circuit configured to generate a sensing current based on the drive voltage, and send the sensing current to a fingerprint signal processor, wherein the sensing current is equal to a product of a transconductance gain of the second converting circuit and the voltage variation, and the fingerprint signal processor performs fingerprint sensing based on the sensing current;

wherein the second converting circuit comprises a first n-channel metal-oxide-semiconductor (NMOS) transistor, a second NMOS transistor, a third NMOS transistor, a first p-channel metal-oxide-semiconductor (PMOS) transistor, a second PMOS transistor, and a third PMOS transistor, wherein, a control terminal of the first PMOS transistor is connected to the first converting circuit to receive the drive voltage, a first electrode of the first PMOS transistor is connected to the fingerprint signal processor, and a second electrode of the first PMOS transistor is connected to a first electrode of the third PMOS transistor;

a control terminal of the second PMOS transistor is configured to receive the reference voltage, a first electrode of the second PMOS transistor is connected to the fingerprint signal processor, and a second electrode of the second PMOS transistor is connected to the first electrode of the third PMOS transistor;

a control terminal of the third PMOS transistor is configured to receive a second control voltage, and a second electrode of the third PMOS transistor is configured to receive a third voltage signal;

a control terminal of the first NMOS transistor is connected to the control terminal of the first PMOS transistor via a level shifter, a first electrode of the first NMOS transistor is connected to the fingerprint signal processor, and a second electrode of the first NMOS transistor is connected to a first electrode of the third NMOS transistor;

a control terminal of the second NMOS transistor is connected to the control terminal of the second PMOS transistor via another level shifter, a first electrode of the second NMOS transistor is connected to the fingerprint signal processor, and a second electrode of the second NMOS transistor is connected to the first electrode of the third NMOS transistor; and a control terminal of the third NMOS transistor is configured to receive a first control voltage, and a second electrode of the third NMOS transistor is grounded.

14. A fingerprint sensing apparatus, comprising the fingerprint sensing circuit according to claim 11.

15. A fingerprint sensing apparatus, comprising the fingerprint sensing circuit according to claim 12.

16. A fingerprint sensing apparatus, comprising the fingerprint sensing circuit according to claim 13.

* * * * *